(12) United States Patent
Tsumura

(10) Patent No.: US 9,761,577 B2
(45) Date of Patent: Sep. 12, 2017

(54) SEMICONDUCTOR DEVICE

(71) Applicant: SII Semiconductor Corporation, Chiba-shi, Chiba (JP)

(72) Inventor: Kazuhiro Tsumura, Chiba (JP)

(73) Assignee: SII Semiconductor Corporation (JP)

( * ) Notice: Subject to any disclaimer, the term of this patent is extended or adjusted under 35 U.S.C. 154(b) by 0 days.

(21) Appl. No.: 15/064,237

(22) Filed: Mar. 8, 2016

(65) Prior Publication Data
US 2016/0268247 A1    Sep. 15, 2016

(30) Foreign Application Priority Data

Mar. 12, 2015  (JP) .................................. 2015-049780

(51) Int. Cl.
*H01L 27/02* (2006.01)
*H01L 23/34* (2006.01)
*H01L 27/088* (2006.01)
*H01L 29/78* (2006.01)

(52) U.S. Cl.
CPC .......... *H01L 27/0251* (2013.01); *H01L 23/34* (2013.01); *H01L 27/088* (2013.01); *H01L 29/7835* (2013.01)

(58) Field of Classification Search
CPC .............................. H01L 23/34; H01L 27/088
See application file for complete search history.

(56) References Cited

U.S. PATENT DOCUMENTS

2006/0043501 A1*  3/2006  Saito .................. H01L 29/0692
                                                              257/401

OTHER PUBLICATIONS

Abstract, Publication No. 03-034360 Publication Date Feb. 14, 1991.
Abstract, Publication No. 08-236709, Publication Date Sep. 13, 1996.

* cited by examiner

*Primary Examiner* — Dung Le
(74) *Attorney, Agent, or Firm* — Adams & Wilks

(57) ABSTRACT

A semiconductor device includes a power element and a heat sensing element configured to detect a temperature of the power element. The power element includes lateral MOS transistors having drains, two of the drains being shorter in length than the remaining drains, and the heat sensing element has a rectangular shape and is disposed between the two shorter drains to accurately detect the temperature of the power element.

4 Claims, 10 Drawing Sheets

SEMICONDUCTOR DEVICE

BACKGROUND OF THE INVENTION

1. Field of the Invention

The present invention relates to a semiconductor device having a function of detecting overheat.

2. Description of the Related Art

Heat is generated in semiconductor integrated circuits due to, for example, an operation of an active element and charges flowing into the semiconductor integrated circuit from outside thereof. Thus, a heat sensing element is formed, and the semiconductor integrated circuit is controlled based on a signal from the heat sensing element, to thereby prevent abnormal operation and breakdown of the circuit caused by overheat. As the heat sensing element, for example, a forward voltage of a PN junction is used. To be specific, when a constant current is caused to flow through a PN junction in a forward direction, potentials of both ends of the PN junction differ from each other. This potential difference is changed depending on temperature, and hence this potential difference is used as a signal for overheating detection (see, for example, Japanese Patent Application Laid-open No. H08-236709 and Japanese Patent Application Laid-open No. H03-034360).

In the field of semiconductor integrated circuits, downsizing of components has been promoted. Because a temperature increase of a component is increased in inverse proportion to an area thereof, a local temperature increase has become intense along with the promotion of downsizing in recent years. As an amount of locally generated heat is increased, a temperature difference between a heat generating source and a heat sensing element is increased. In order to solve this problem, forming the heat generating source and the heat sensing element as close as possible to each other is effective.

In each of Japanese Patent Application Laid-open No. H08-236709 and Japanese Patent Application Laid-open No. H03-034360, a method is employed in which a semiconductor layer 1 that is a heat generating source and a semiconductor layer 2 that is a heat sensing element are isolated from each other by an insulating film, thereby enabling the heat generating source and the heat sensing element to be closely arranged.

In general, the area of the heat generating source is larger than the area of the heat sensing element. Thus, as illustrated in FIG. 1 of Japanese Patent Application Laid-open No. H08-236709, it is preferred that part of the heat generating source be cut out in a plan view so that the heat sensing element can be arranged in the cut out portion. This is because, with this configuration, the heat sensing element is surrounded by the heat generating source, and can thus more accurately sense a temperature of the heat generating source.

In each of Japanese Patent Application Laid-open No. H08-236709 and Japanese Patent Application Laid-open No. H03-034360, a case is specifically described where a power element is formed of vertical transistors. A basic cell of the vertical transistor has a square or an almost square shape in general, and hence it is easy to cut out part of the heat generating source in a plan view so that the heat sensing element can be arranged in the cut out portion, as illustrated in FIG. 1 of Japanese Patent Application Laid-open No. H08-236709.

However, in a case of a power element formed of lateral transistors, part of a heat generating source has not hitherto been cut out in a plan view because of the following difficulty. In this case, the lateral transistors are transistors that have a long width and are arrayed at equal pitches. Further, one common source serves as sources of channels of two transistors. Further, one common drain serves as drains of channels of two transistors. That is, adjacent two transistors have the common source and the common drain, and hence it is difficult to change widths of part of the transistors.

Alternatively, the sources or the drains as described above are not used in common purposely so that widths of part of the transistors can be narrowed, to thereby realize a shape having a portion cut out in a plan view. However, this method has disadvantages in that pitches at which the transistors are arranged are increased and an amount of heat generated per unit area is thus decreased, with the result that a temperature near a heat sensing element is lowered.

SUMMARY OF THE INVENTION

The present invention has been made in view of the above-mentioned problems, and has an object to provide a semiconductor device including a power element formed of lateral transistors in which sources, drains, channels, and electric field relaxation regions forming the transistors are deformed, thereby being capable of more accurately sensing a temperature of the power element.

In order to solve the above-mentioned problems, the present invention takes the following measures.

According to one embodiment of the present invention, there is provided a semiconductor device, including: a power element that is potentially broken down due to heat generated by a current flowing therethrough when the power element is in a conductive state; and a heat sensing element configured to detect temperature, the power element being formed on a first semiconductor layer, the heat sensing element being formed on a second semiconductor layer, the first semiconductor layer and the second semiconductor layer being isolated from each other by an insulating film, in which at least two sides of the heat sensing element are adjacent to the power element in a plan view, in which the power element includes a plurality of lateral MOS transistors arranged at equal pitches, and in which a difference between a source width and a drain width of at least one of the plurality of lateral MOS transistors that is adjacent to the heat sensing element differs from a difference between a source width and a drain width of another one of the plurality of lateral MOS transistors that is located farther from the heat sensing element.

With the use of the above-mentioned measures, it is possible to provide the semiconductor device capable of more accurately sensing a temperature of the power element.

DETAILED DESCRIPTION OF THE INVENTION

Modes for carrying out the present invention are described in the following by way of embodiments with reference to the drawings.

First Embodiment

Figure 1A:
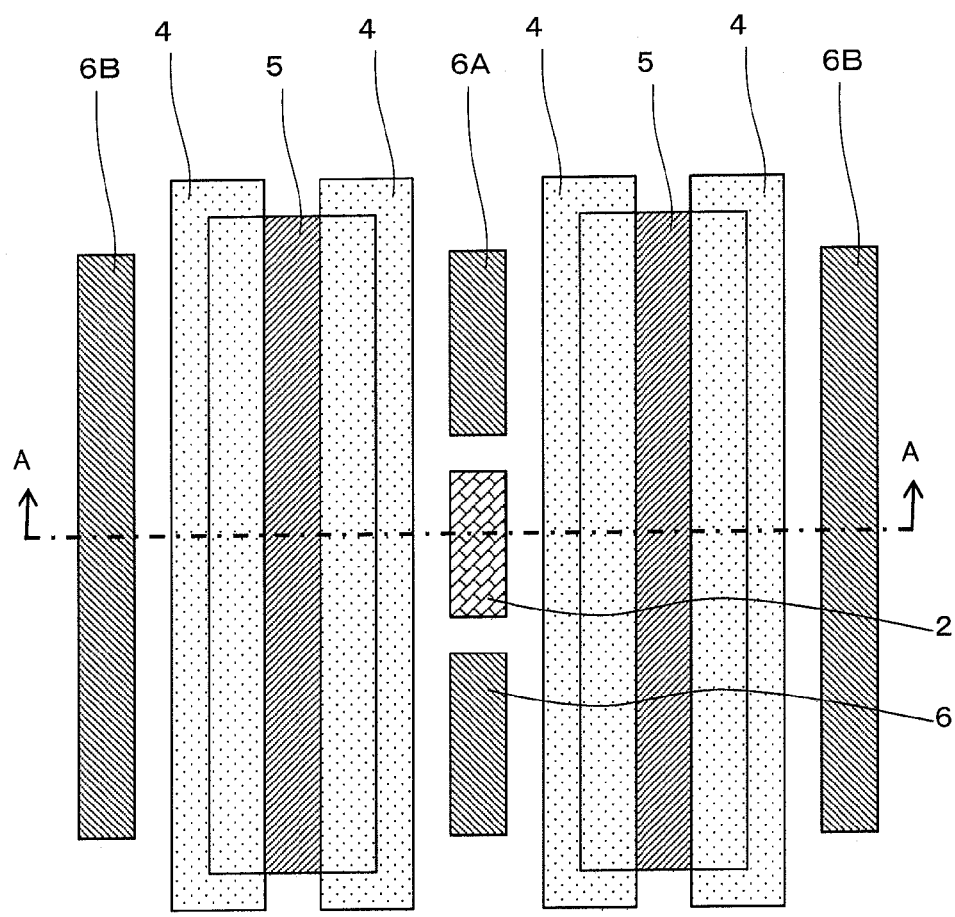
FIG. 1A is an arrangement plan view of a power element and a heat sensing element in a semiconductor device according to the first embodiment of the present invention.
Figure 1B:
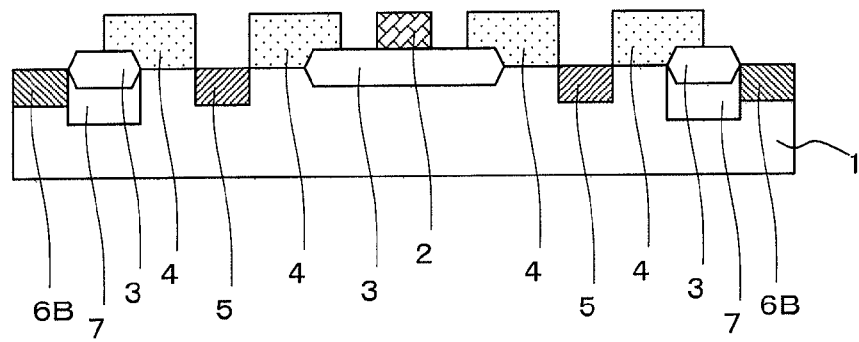
FIG. 1B is a sectional view thereof taken along line A-A in FIG. 1A.

FIG. 1A is a plan view for illustrating an arrangement of a power element and a heat sensing element of the present invention. FIG. 1B is a sectional view taken along the cutting line A-A of FIG. 1A. The power element is formed on a first semiconductor layer 1. A heat sensing element 2 is made from a second semiconductor layer 2 different from the first semiconductor layer 1, i.e., the second semiconductor layer 2 constitutes the heat sensing element 2. The heat sensing element 2 basically has a rectangular shape and is surrounded by four sides. The first semiconductor layer and the second semiconductor layer are isolated from each other through the intermediation of a LOCOS oxide film 3 for element isolation. In this case, the first semiconductor layer 1 is a semiconductor substrate, and the second semiconductor layer 2 is made of, for example, polycrystalline silicon.

Transistors forming the power element are lateral MOS transistors each having a gate electrode 4, a source 5, drains 6A and 6B, and a drain electric field relaxation region 7. Heat generation is proportional to electric power that is a product of voltage and current, and hence heat generation at the power element often becomes a problem, which has a high breakdown voltage and thus has a high voltage. In view of this, there is described a high breakdown voltage transistor of a type using, as the drain electric field relaxation region 7, the LOCOS oxide film 3 that is used for element isolation in general. This transistor is hereinafter referred to as a LOCOS drain type.

A technique of arranging transistors having large channel widths at equal pitches is commonly used in an element through which large current is caused to flow, such as the power element. Now, as illustrated in FIG. 1A, a width of one drain 6A of a plurality of transistors forming the power element is shortened to form a free space so that the heat sensing element can be arranged in the free space. The channel width is determined by a width of the source 5, and the width of the source and the channel width are the same in this embodiment.

The transistor of the LOCOS drain type, which is one of ordinary transistors, has the drains 6A and 6B surrounded by the drain electric field relaxation region 7. That is, the drain electric field relaxation region 7 has a width larger than those of the drains 6A and 6B. Thus, taking the size of the drain electric field relaxation region 7 into consideration, a width of a drain 6 is set to be smaller than the width of the source 5 in many cases. As described above, the width of the drain and the width of the source differ from each other in general.

In FIG. 1A, the width of one drain 6A is shortened, but the width of the source through which a current flows to this drain is not narrowed. Thus, a difference in width between the source and the drain of the transistor adjacent to the heat sensing element is different from and larger than a difference in width between the source and the drain of the transistor not adjacent to the heat sensing element.

In general, it is said that a current flowing through a transistor is proportional to a channel width of the transistor and is inversely proportional to a channel length thereof, and a length in the same direction as this width is referred to as the width in order not to confuse whether the width refers to a length in an up and down direction or a right and left direction. In the drawings, the width refers to a length in the up and down direction of the drawing sheet.

The case is described above where the first semiconductor layer and the second semiconductor layer are isolated from each other by the LOCOS oxide film, but the present invention is not limited thereto. The essence of the present invention is not lost even with the use of other insulating films instead of the LOCOS oxide film.

The case is described above where the lateral MOS transistor is the transistor of the type using the LOCOS oxide film as the electric field relaxation region, but the present invention is not limited thereto. The essence of the present invention is generally applied to lateral MOS transistors.

The widths of the drain and the source differ from each other in general, but the essence of the present invention is not lost even if there is no width difference. In this case, a difference in width between the source and the drain of the transistor not adjacent to the heat sensing element is zero, whereas a difference in width between the source and the drain of the transistor adjacent to the heat sensing element is not zero.

Figure 2:
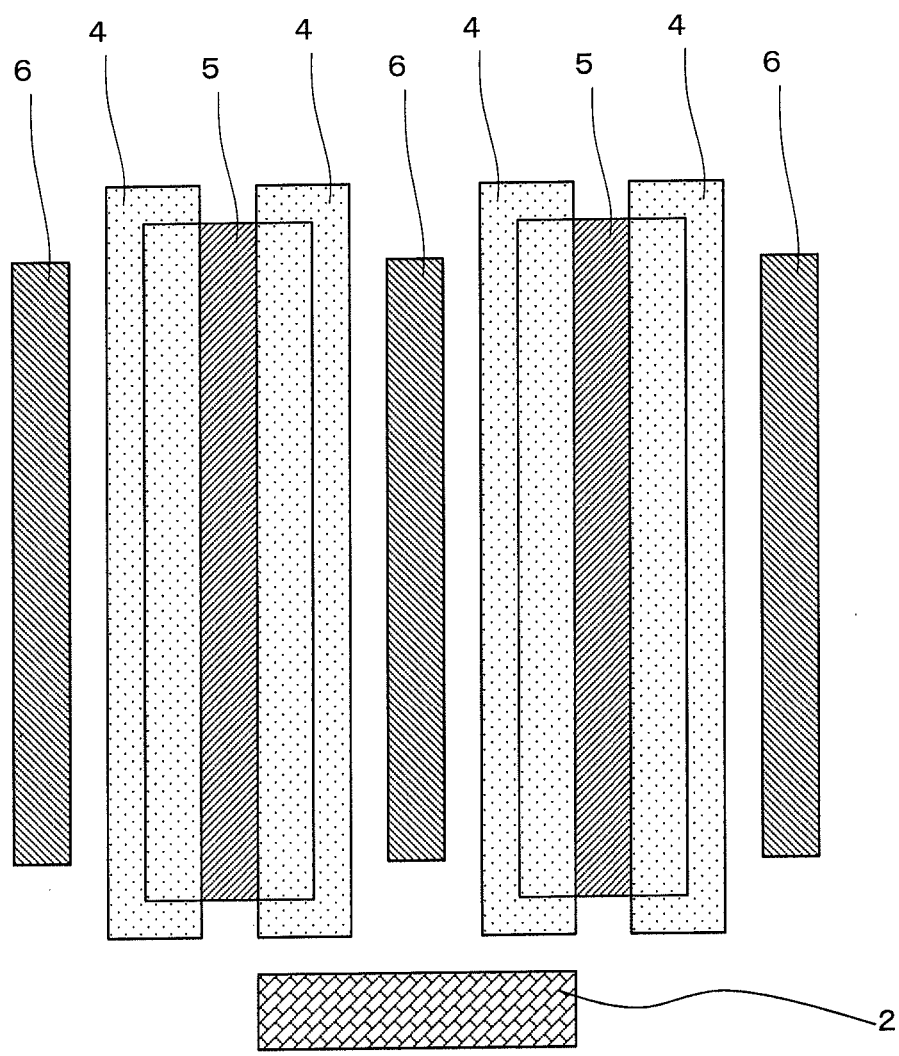
FIG. 2 is an arrangement plan view of a power element and a heat sensing element in a related-art semiconductor device.
Figure 3:
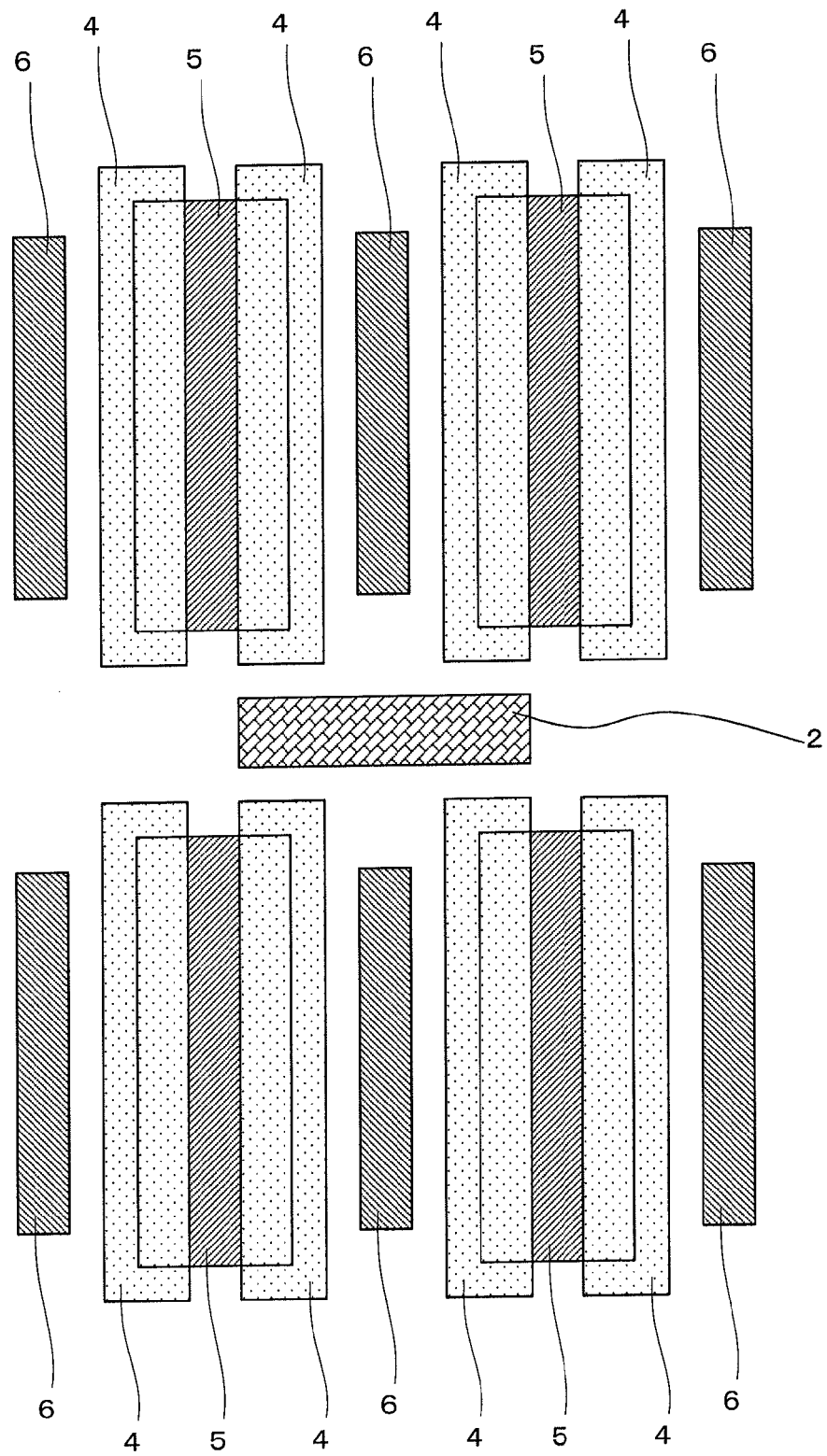
FIG. 3 is an arrangement plan view of a power element and a heat sensing element in a related-art semiconductor device.

FIG. 2 and FIG. 3 are plan views for illustrating related-art semiconductor devices as comparative examples. FIG. 2 is a plan view of the related-art semiconductor device. A heat sensing element is arranged so as to be adjacent to a power element including transistors that have the same width and are arrayed at equal pitches. FIG. 3 is a plan view of a case where the heat sensing element is arranged so as to be surrounded by the power element in two directions with the use of the related art. In FIG. 3, the two sides of the heat sensing element face the power element, and hence a temperature of the power element can be sensed more accurately than in the case of FIG. 2. In contrast, in the semiconductor device of this embodiment illustrated in FIG. 1, the four sides of the heat sensing element face the power element, and hence a temperature of the power element can be sensed more accurately than in the related-art semiconductor devices illustrated in FIG. 2 and FIG. 3.

Second Embodiment

Figure 4:
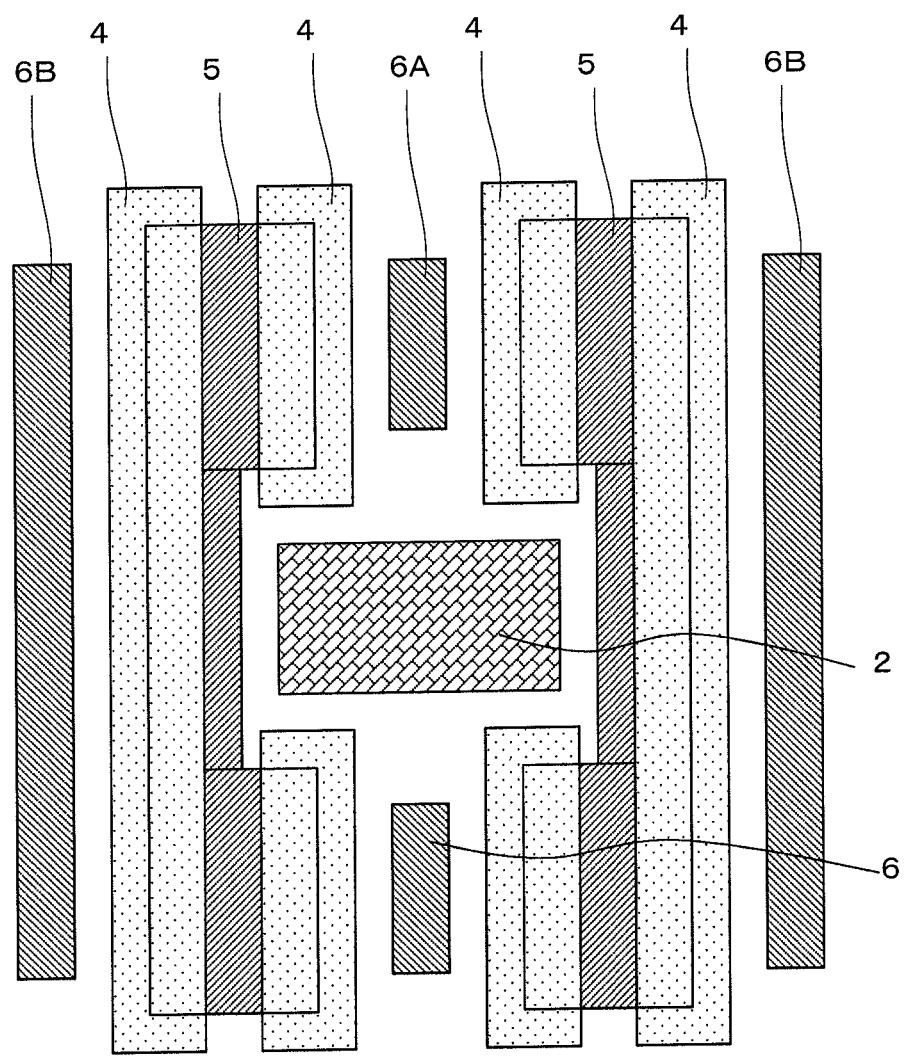
FIG. 4 is an arrangement plan view of the power element and the heat sensing element in the semiconductor device according to the second embodiment of the present invention.

There may be a case where an enough space for heat sensing element arrangement cannot be secured by deforming only one drain as in the first embodiment. In this case, a channel and a source need to be deformed as well. This case is illustrated in FIG. 4. In FIG. 4, not only the drain 6A closest to the heat sensing element, but also part of the gate electrodes 4 and part of the sources 5, which are arranged in the vicinity of the heat sensing element, are removed to narrow the channel widths. In this case, the channel refers to a portion where a region in which the LOCOS oxide film surrounding the source 5 does not exist (namely, an active region), and the gate electrode 4 overlap with each other. In FIG. 4, in the transistors respectively including the sources 5 and the drains 6B illustrated on both the right and left sides of the heat sensing element 2, the sources 5 are partially removed on the heat sensing element side and are thus thin. However, the removal has almost no influence.

Third Embodiment

Figure 5:
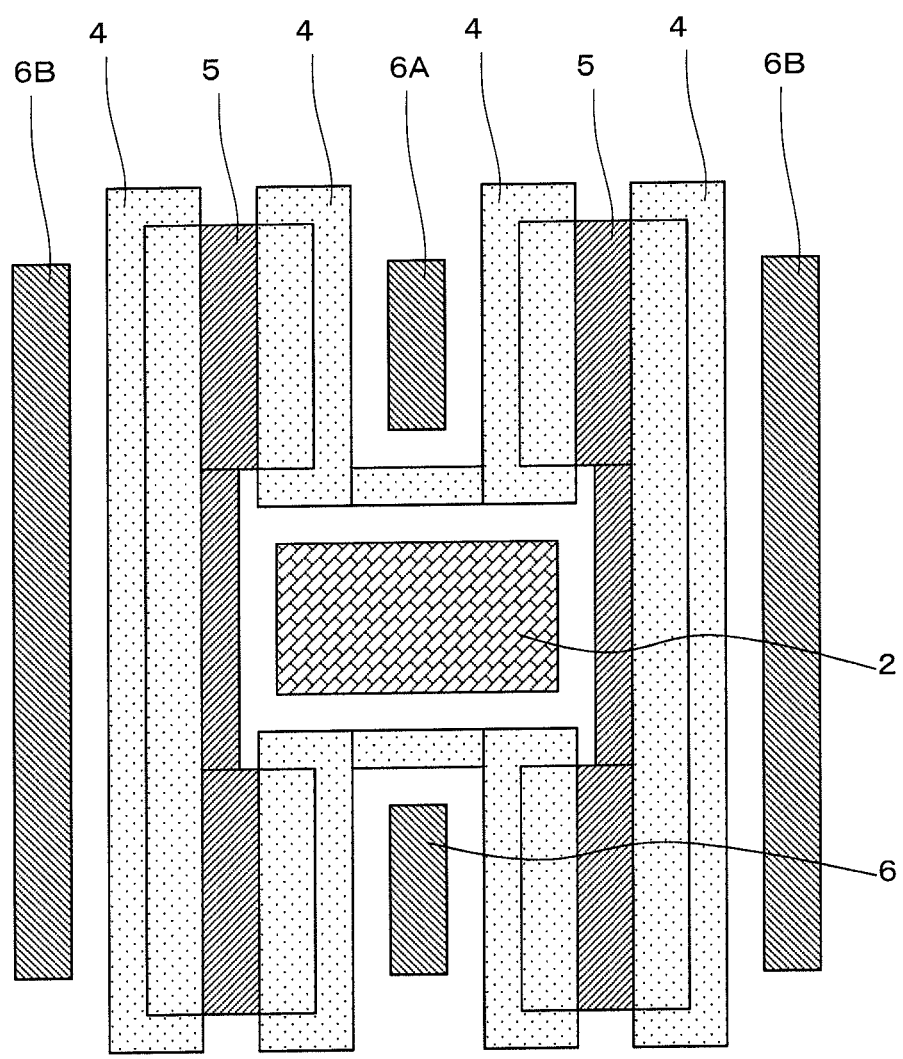
FIG. 5 is an arrangement plan view of the power element and the heat sensing element in the semiconductor device according to the third embodiment of the present invention to which a countermeasure for a parasitic channel is applied.

There may be a case where a parasitic channel is formed by a potential of a heat sensing element and wiring to the heat sensing element, due to the existence of the heat sensing element. Thus, in the arrangement of FIG. 4, the parasitic channel may be formed, and current may flow from the source to the drain via the parasitic channel. In view of this, the gate electrodes having the shortened widths are connected to each other as illustrated in FIG. 5. With this gate electrode arrangement, current can be prevented from flowing to the drain via the parasitic channel.

This technique may be applied to the sides of the power element that do no face the heat sensing element. However, such application is not related to the present invention, and is herein omitted.

Fourth Embodiment

Figure 6:
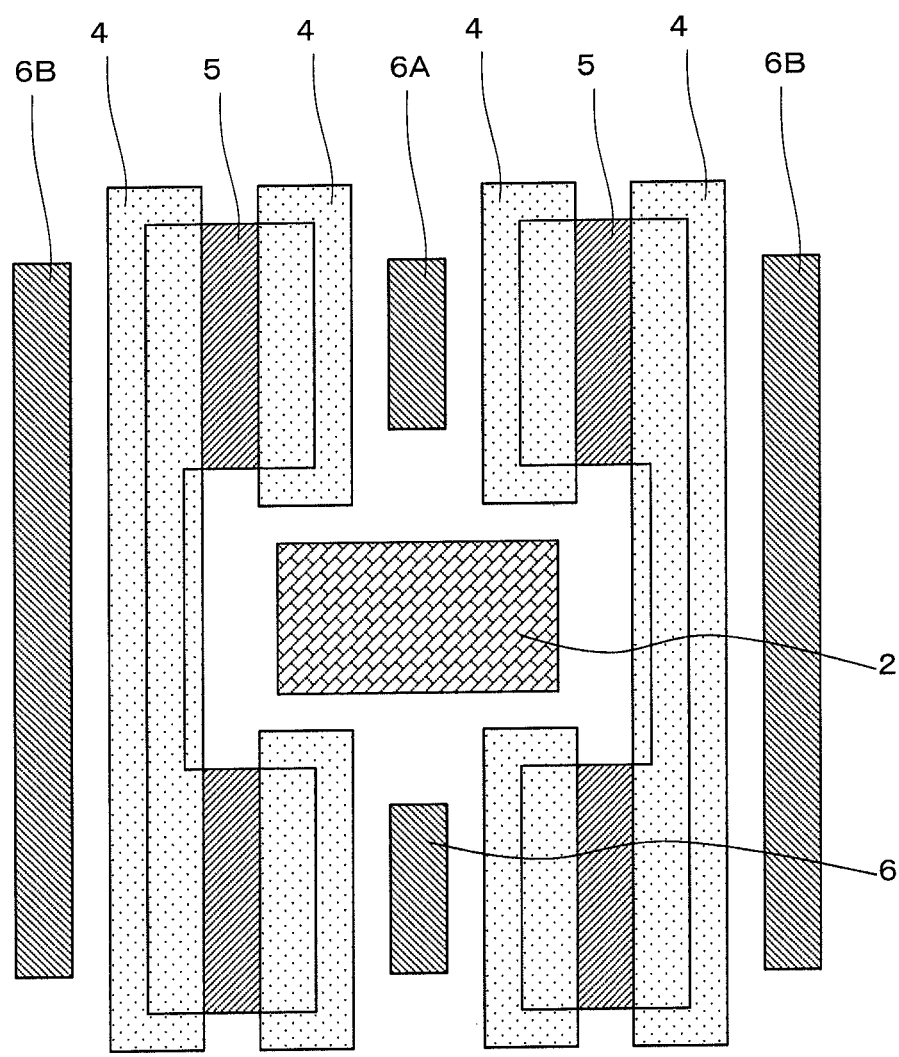
FIG. 6 is an arrangement plan view of the power element and the heat sensing element in the semiconductor device according to the fourth embodiment of the present invention to which a countermeasure for parasitic bipolar formation is applied.

In an actual power element, noise is often input to a drain terminal from the outside of a chip. A parasitic bipolar current may transitionally flow due to such noise. In general, the parasitic bipolar current is generated when a state is established where a forward current flows through the connection between a source and a substrate. This current is not the one that only flows through a channel. Thus, even if there is no channel, the current concentrates on part of the drain that is located near the source having a greatly larger width than the drain width. A temperature of part of the drain on which the current concentrates is locally increased, with the result that the power element easily breaks down due to heat. This current concentration is liable to occur in the embodiments illustrated in FIG. 4 and FIG. 5, which are basic configurations for describing the principle and in which no consideration is given to such factors. An arrangement to which a countermeasure for this problem is applied is illustrated in FIG. 6. Parts of the sources of the transistors located on both the sides of the heat sensing element, which are not adjacent to the channels, are removed. With this, the sources are not formed in those parts without fail even if components are arranged at positions shifted from proper positions, which often occurs in manufacturing semiconductor devices. Part of the channels of the transistors located on both the sides of the heat sensing element is also not formed. In this manner, the parasitic bipolar current flowing from the source can be prevented from concentrating on a part of the drain.

Fifth Embodiment

In a case where the power element includes N-type MOS transistors, the parasitic bipolar current described in the fourth embodiment (FIG. 6) is generated when a forward current flows between N-type sources and a P-type substrate. In view of this, even when the thin active regions of the sources of FIG. 4 and FIG. 5 remain, the forward current flowing from the source to the substrate can be eliminated by using, as this active region, a P-type active region having the same polarity as the P-type substrate. An arrangement of FIG. 7 corresponds to the arrangement of FIG. 4 to which this idea is applied. The regions of the sources of FIG. 4 that cause the current concentration are changed to substrate contact regions 8 having the same polarity as the substrate. In this manner, the regions being prevented from functioning as the MOS transistors are formed, thereby being capable of preventing the parasitic bipolar current from concentrating on a part of the drain.

Sixth Embodiment

Figure 7:
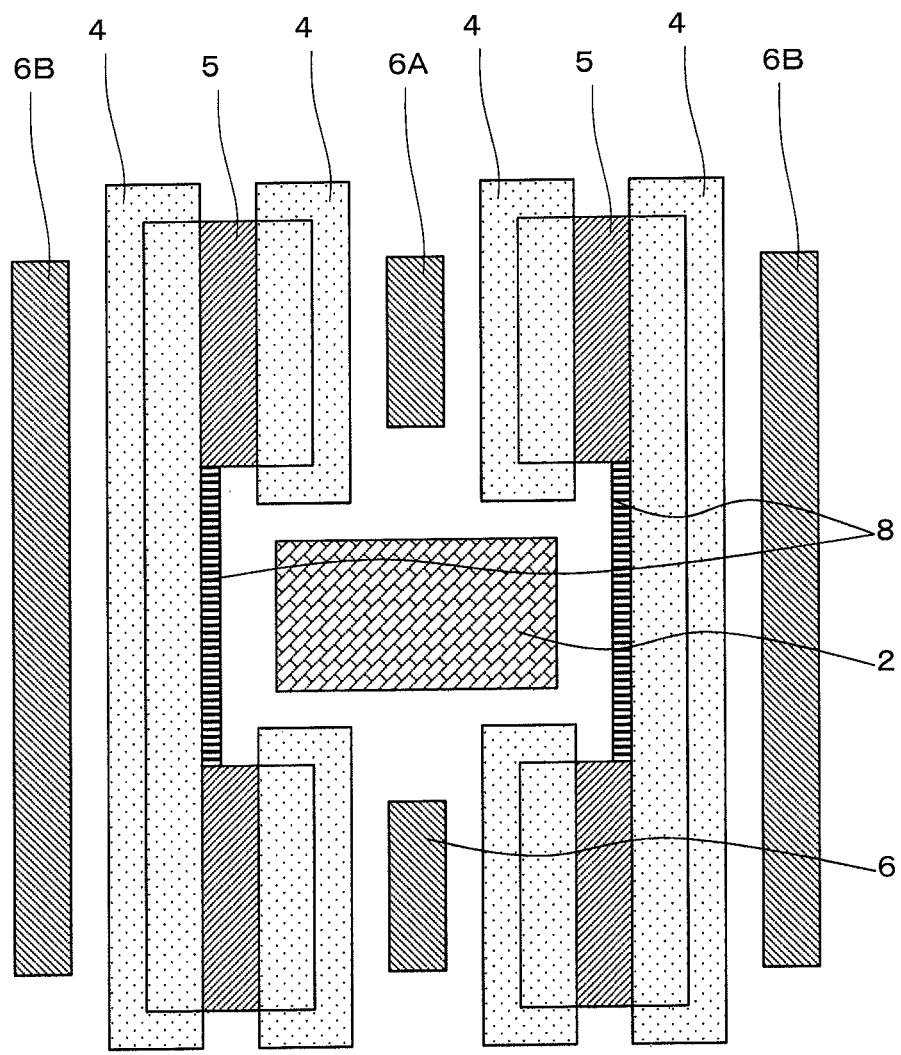
FIG. 7 is an arrangement plan view of the power element and the heat sensing element in the semiconductor device according to the fifth embodiment of the present invention to which a countermeasure for parasitic bipolar formation is applied.

In the plan view of FIG. 7 for illustrating the fifth embodiment, a current may flow from the source to the drain via the parasitic channel. As one of countermeasures for this, the technique described in the third embodiment (FIG. 5) is given. In addition, as another technique, parts of the sources facing the element isolation regions are changed to the substrate contact regions having the same polarity as the substrate. An arrangement of FIG. 8 corresponds to the arrangement of FIG. 7 to which this idea is applied.

If the power element includes N-type MOS transistors, an element isolation region is of the P type and a source and a drain are of the N type. When the polarity of the element isolation region is changed from the P type to the N type under the influences of wiring and the like, the polarity becomes the N type throughout a path from the source to the drain via the element isolation region, and current thus flows through the path. This current path is referred to as a parasitic channel, and the current is referred to as a parasitic channel leakage. When a part of the source facing the element isolation region is a P-type source having the same polarity as the substrate, the polarity does not become the N type throughout the above-mentioned path, and hence no parasitic channel leakage flows through the path.

Figure 8:
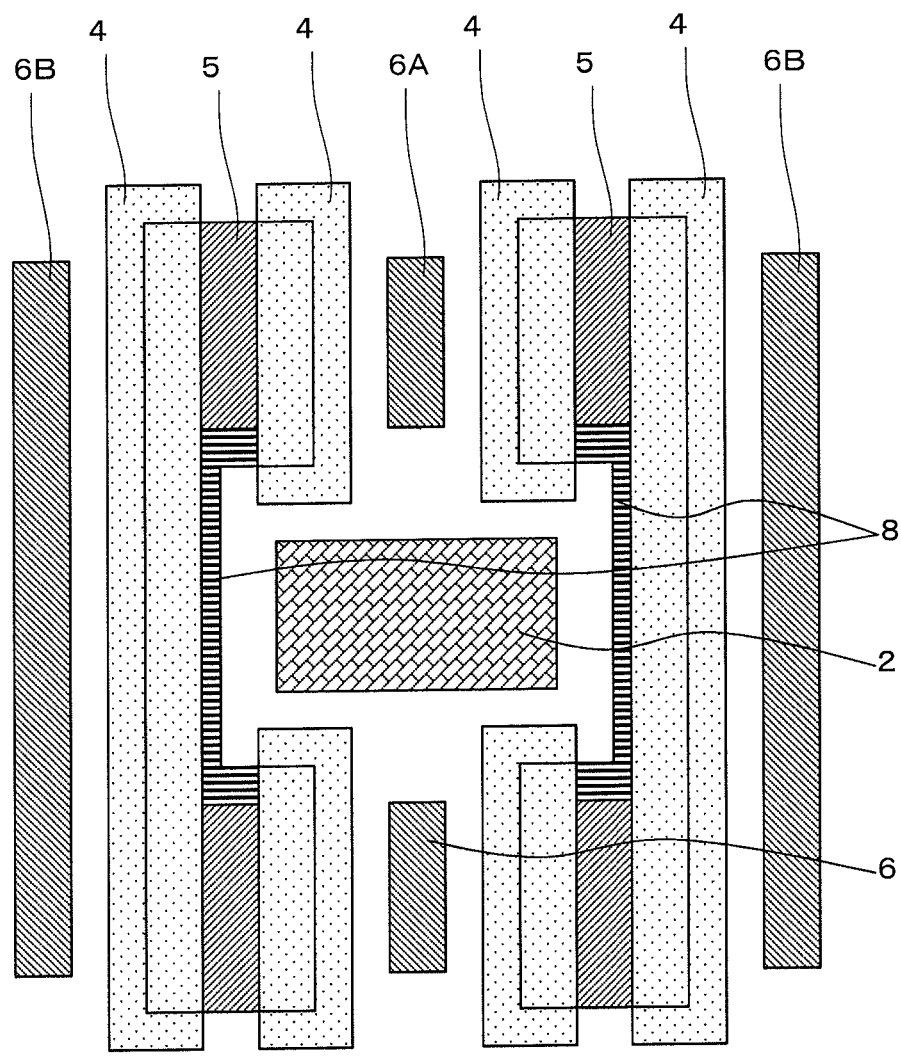
FIG. 8 is an arrangement plan view of the power element and the heat sensing element in the semiconductor device according to the sixth embodiment of the present invention to which countermeasures for a parasitic channel and parasitic bipolar formation are applied.

In FIG. 8, in the source region deformed for the heat sensing element arrangement, all regions facing the LOCOS oxide films serving as the element isolation regions are changed to the substrate contact regions 8. With this, generation of the parasitic channel is prevented.

Seventh Embodiment

Figure 9:
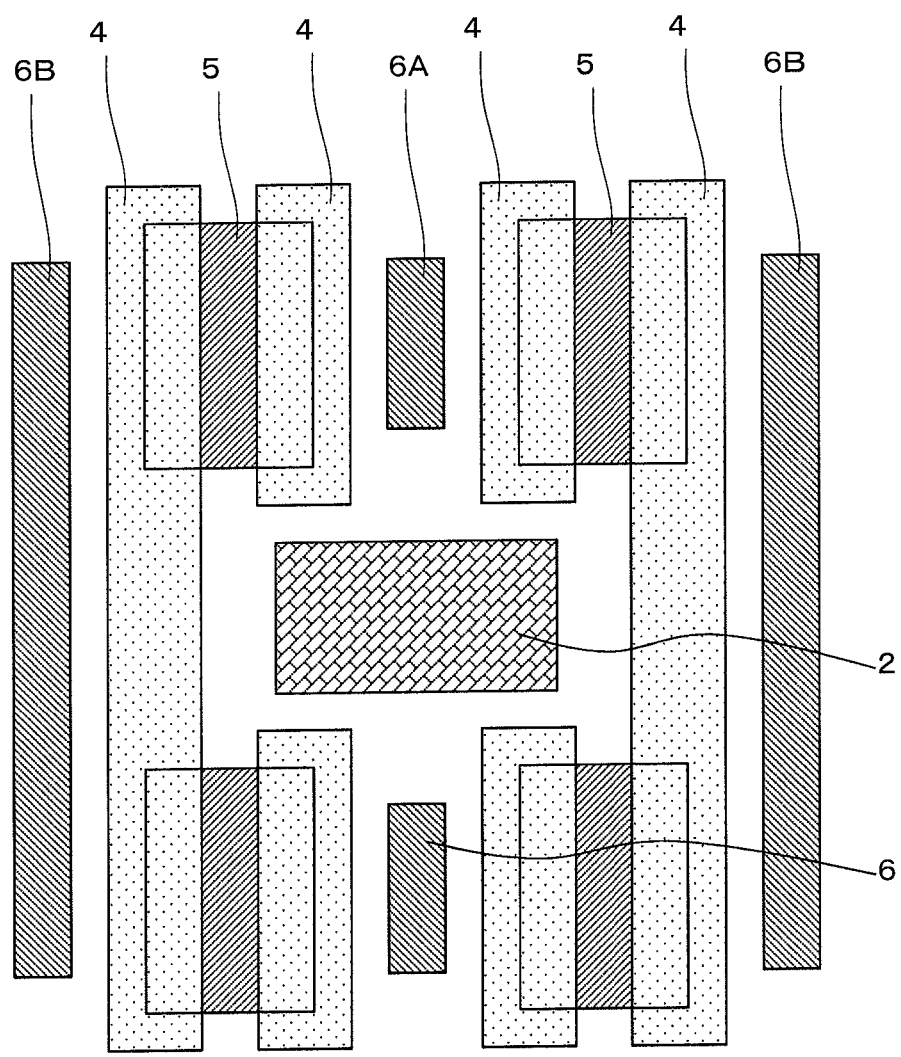
FIG. 9 is an arrangement plan view of the power element and the heat sensing element in the semiconductor device according to the seventh embodiment of the present invention to which a countermeasure for parasitic bipolar formation is applied.

FIG. 9 is an illustration of one of techniques for preventing the parasitic bipolar current from locally concentrating on a part of the drain, which is described in the fourth embodiment (FIG. 6). The width of the drain 6A is reduced for the heat sensing element arrangement, and the channel width and the width of the source 5 of the transistor including the drain having the reduced width are reduced based on the reduced width of the drain 6A. With this, as illustrated in FIG. 9, the drains 6B, which are not adjacent to the heat sensing element, are larger than the sources 5 adjacent to the heat sensing element. The parasitic bipolar current is generated when a forward current flows from the source to the substrate, and hence when the drains 6B are larger than the sources 5 as described above, the current concentration does not occur.

Eighth Embodiment

Figure 10:
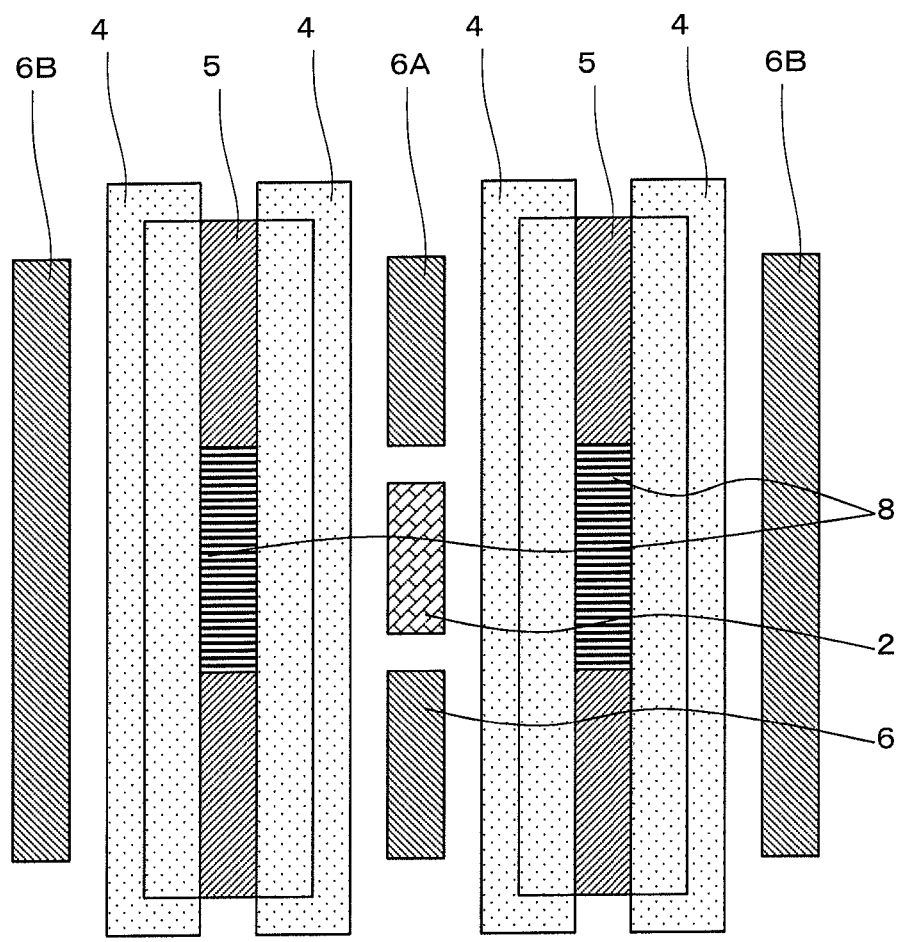
FIG. 10 is an arrangement plan view of the power element and the heat sensing element in the semiconductor device according to the eighth embodiment of the present invention to which a countermeasure for parasitic bipolar formation is applied.

FIG. 10 is an illustration of an arrangement obtained from the arrangement of FIG. 1, which was described in connection with the first embodiment, by adding a countermeasure for parasitic bipolar current. In FIG. 1, the source is larger than the drain in part, and hence in FIG. 10 part of the source is changed to the substrate contact region, to thereby prevent the current concentration.

In general, when the width of the source adjacent to the channel is larger than the width of the drain, charges flowing through a normal channel locally concentrate to the drain. Thus, the density of impact ionization is locally large that occurs when the charges flowing through the channel are accelerated by an electric field in the vicinity of the drain. As a result, a phenomenon is liable to occur in which a substrate current generated by the impact ionization raises a substrate potential, and a forward current flows from the source to the substrate. Further, the density of the impact ionization is large, and hence characteristic deterioration called hot carrier shift is locally large in general. Through the application of the techniques described in this embodiment, those problems are also solved.

Ninth Embodiment

The second semiconductor layer, on which the heat sensing element is formed, is made of the same polycrystalline silicon that is used for the gate electrodes. Then, the heat sensing element can be formed without any additional step. In all the arrangements described in the first embodiment to the eighth embodiment, the gate electrodes and the heat sensing element do not overlap with each other, and hence this technique can be applied to all the embodiments described above.

In the description of the first to eighth embodiments, an inter-layer insulating film and wiring including contacts located above the gate electrodes are omitted. Those components are arranged by an ordinary technology used in manufacturing semiconductor devices, that is, the arrangement method thereof is the matter that a person skilled in the art knows. Thus, the description of those components is omitted.

In the description of the first to eighth embodiments, the arrangements are described in which all the four sides of the heat sensing element are surrounded by the power element, but the present invention is not limited thereto. For example, a recessed power element having one recessed side is used and a heat sensing element is arranged in the recessed region. In this case, the three sides of the heat sensing element are surrounded by the power element. Even in this case, the essence of the present invention is not lost. In this case, as compared to the case where all the four sides are surrounded, a difference between a temperature at the maximum temperature point of the power element and a temperature at the heat sensing element is large. However, wiring is easily led out from the heat sensing element. This method may be preferred in the configuration with a few wiring layers.

Further, when a rectangular power element is formed of arrayed MOS transistors, and the MOS transistor near the tip of the power element is deformed for the heat sensing element arrangement, the two sides of the heat sensing element are surrounded by the power element. Even in this case, the essence of the present invention is not lost. In this case, a difference between a temperature at the maximum temperature point of the power element and a temperature at the heat sensing element is larger than in the case in which the three sides are surrounded. However, required performance may be satisfied even with such an arrangement if heat generated by the power element is relatively small. In that case, this arrangement can be selected by taking other circuits, a chip area, and the like into consideration on the whole.

What is claimed is:

1. A semiconductor device, comprising:
a power element formed on a first semiconductor layer and having a plurality of lateral MOS transistors arranged at equal pitches in a first direction, the plurality of lateral MOS transistors having drains that extend in a second direction perpendicular to the first direction, two of the drains being shortened drains that have a width shorter in the second direction than that of the remaining drains of the plurality of lateral MOS transistors; and
a rectangular heat sensing element made from a second semiconductor layer isolated from the first semiconductor layer by an insulating film, the rectangular heat sensing element being configured to detect a temperature of the power element and being arranged between the two shortened drains of the plurality of lateral MOS transistors so that at least two sides of the rectangular heat sensing element are adjacent to the power element in a plan view.

2. A semiconductor device according to claim 1; wherein a difference between a source width and a drain width of the shortened drains in the second direction is larger than a difference between a source width and a drain width in the second direction of another one of the plurality of lateral MOS transistors that is located farther from the rectangular heat sensing element.

3. A semiconductor device according to claim 1, wherein a side of each of the drains adjacent to the rectangular heat sensing element is surrounded by a gate electrode.

4. A semiconductor device according to claim 1, wherein the second semiconductor layer from which the rectangular heat sensing element is made, and the first semiconductor layer from which a gate electrode of the power element is made, are the same.

* * * * *